US012578386B2

(12) United States Patent
Lin et al.

(10) Patent No.: US 12,578,386 B2
(45) Date of Patent: Mar. 17, 2026

(54) SCAN CHAIN CONTROL

(71) Applicant: Taiwan Semiconductor Manufacturing Company, Ltd., Hsinchu (TW)

(72) Inventors: Jia Han Lin, Hsinchu City (TW); Shih-Chang Tsai, Hsinchu City (TW); Feng-Ming Kuo, Hsinchu City (TW); Chung-Sheng Yuan, Hsinchu City (TW); Chung-Hsing Wang, Baoshan Township (TW); Yi-Kan Cheng, Taipei (TW)

(73) Assignee: Taiwan Semiconductor Manufacturing Company, LTD., Hsinchu (TW)

( * ) Notice: Subject to any disclaimer, the term of this patent is extended or adjusted under 35 U.S.C. 154(b) by 62 days.

(21) Appl. No.: 18/607,368

(22) Filed: Mar. 15, 2024

(65) Prior Publication Data

US 2025/0290981 A1     Sep. 18, 2025

(51) Int. Cl.
| | |
|---|---|
| *G01R 31/3185* | (2006.01) |
| *G01R 31/3177* | (2006.01) |
| *G01R 31/3183* | (2006.01) |
| *H03K 3/037* | (2006.01) |

(52) U.S. Cl.
CPC . *G01R 31/318555* (2013.01); *G01R 31/3177* (2013.01); *G01R 31/318392* (2013.01); *G01R 31/318522* (2013.01); *G01R 31/318541* (2013.01); *H03K 3/037* (2013.01)

(58) Field of Classification Search
CPC ........ G01R 31/318555; G01R 31/3177; G01R 31/318392; G01R 31/318522; G01R 31/318541; H03K 3/037
See application file for complete search history.

(56) References Cited

U.S. PATENT DOCUMENTS

| | | | |
|---|---|---|---|
| 8,493,109 | B2 | 7/2013 | Millendorf et al. |
| 8,914,612 | B2 | 12/2014 | Mekhiel |
| 10,024,909 | B2 * | 7/2018 | Semenov ....... G01R 31/318541 |
| 12,306,248 | B2 * | 5/2025 | Khan ............ G01R 31/318558 |
| 2009/0290678 | A1 * | 11/2009 | Yoon ...................... H03K 21/38 |
| | | | 377/119 |

(Continued)

FOREIGN PATENT DOCUMENTS

| | | |
|---|---|---|
| TW | 200928759 A | 7/2009 |
| TW | 201212536 A | 3/2012 |
| TW | 202336753 A | 9/2023 |

OTHER PUBLICATIONS

W.-C. Lien, K.-J. Lee, T.-Y. Hsieh, S.-S. Chien and K. Chakrabarty, "Accumulator-based output selection for test response compaction," 2012 IEEE International Symposium on Circuits and Systems (ISCAS), Seoul, Korea (South), 2012, pp. 2313-2316, (Year: 2012).*

(Continued)

*Primary Examiner* — Cynthia Britt
(74) *Attorney, Agent, or Firm* — Merchant & Gould P.C.

(57) ABSTRACT

Embodiments of the present disclosure are directed to scan chain systems and methods for inputting repeated sequences of bits to a sequence of flip flops that include multi-bit flip flops and single bit flip flops. One example includes a control circuit that includes a bit counter, a multiplexer, a first group control circuit, and a second group control circuit.

20 Claims, 13 Drawing Sheets

(56) References Cited

U.S. PATENT DOCUMENTS

| | | | |
|---|---|---|---|
| 2016/0349318 A1* | 12/2016 | Pereira | G01R 31/318552 |
| 2017/0292993 A1* | 10/2017 | Yoon | H03K 3/0372 |
| 2018/0025757 A1* | 1/2018 | Chan | G11C 7/1072 |
| | | | 365/189.02 |
| 2023/0282263 A1 | 9/2023 | Chiu et al. | |
| 2024/0385241 A1* | 11/2024 | Jain | G01R 31/318547 |
| 2025/0020719 A1* | 1/2025 | Khan | G01R 31/318536 |

OTHER PUBLICATIONS

H. Lim, T. Kim and S. Kang, "Reconfigurable Multi-Bit Scan Flip-Flop for Cell-Aware Diagnosis," in IEEE Transactions on Circuits and Systems II: Express Briefs, vol. 71, No. 4, pp. 2024-2028, Apr. 2024 (Year: 2024).*

* cited by examiner

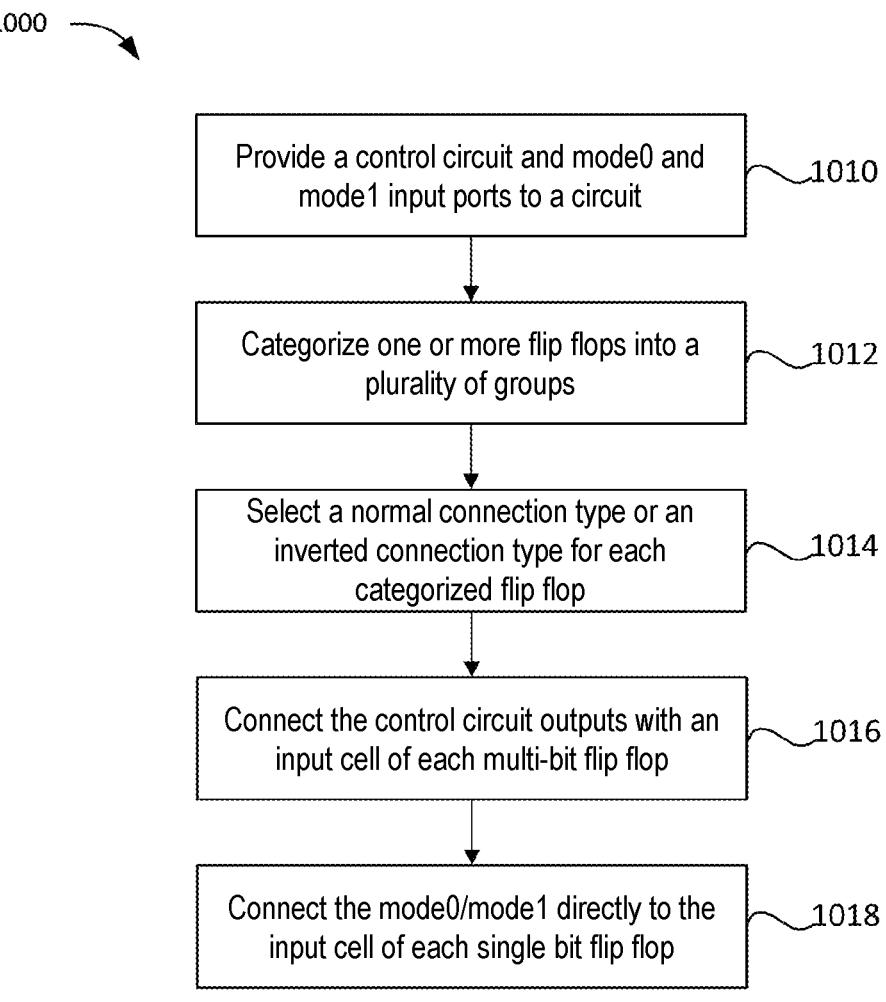

1000

Provide a control circuit and mode0 and mode1 input ports to a circuit — 1010

Categorize one or more flip flops into a plurality of groups — 1012

Select a normal connection type or an inverted connection type for each categorized flip flop — 1014

Connect the control circuit outputs with an input cell of each multi-bit flip flop — 1016

Connect the mode0/mode1 directly to the input cell of each single bit flip flop — 1018

FIG. 10

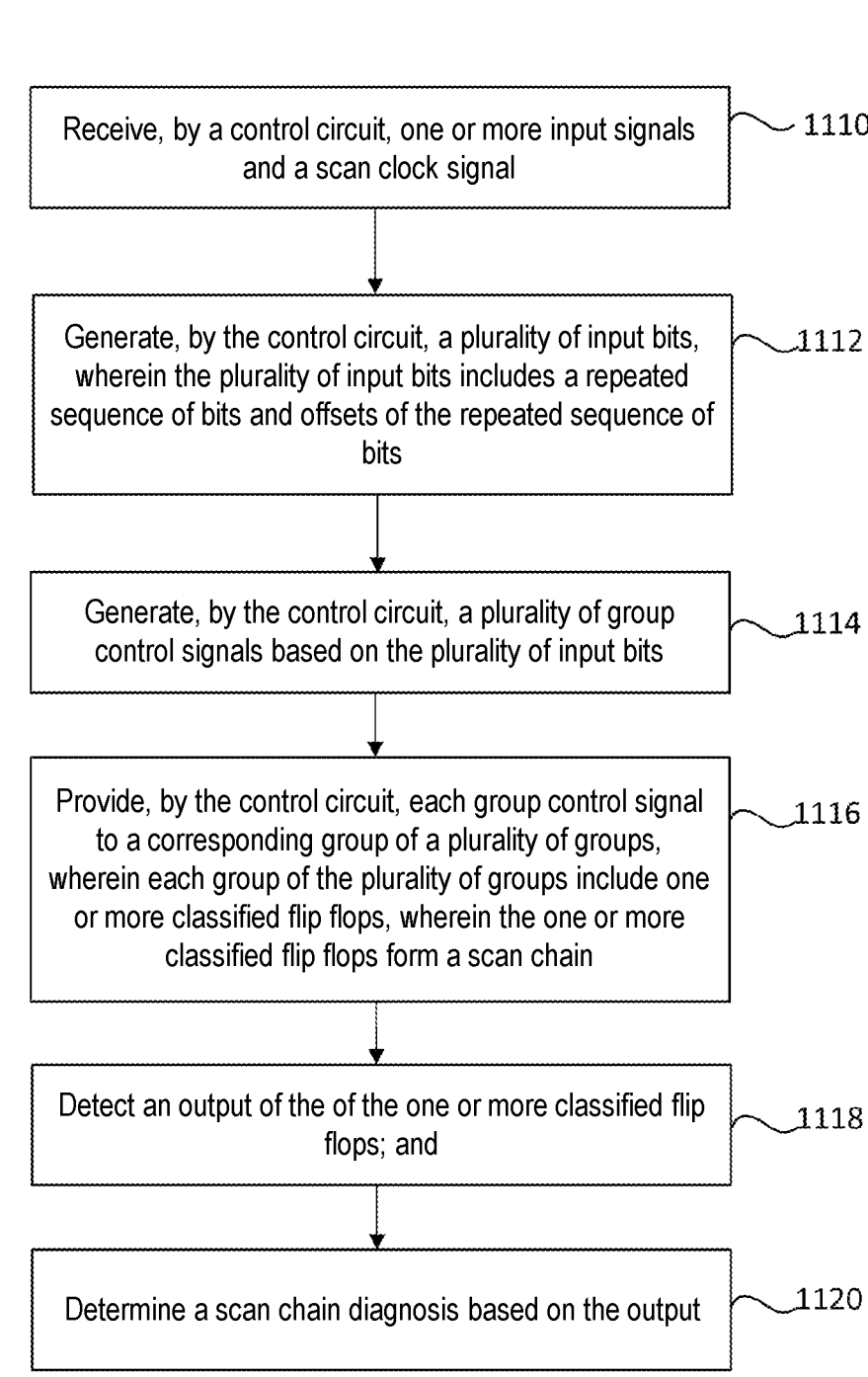

1100

Receive, by a control circuit, one or more input signals and a scan clock signal     1110

Generate, by the control circuit, a plurality of input bits, wherein the plurality of input bits includes a repeated sequence of bits and offsets of the repeated sequence of bits     1112

Generate, by the control circuit, a plurality of group control signals based on the plurality of input bits     1114

Provide, by the control circuit, each group control signal to a corresponding group of a plurality of groups, wherein each group of the plurality of groups include one or more classified flip flops, wherein the one or more classified flip flops form a scan chain     1116

Detect an output of the of the one or more classified flip flops; and     1118

Determine a scan chain diagnosis based on the output     1120

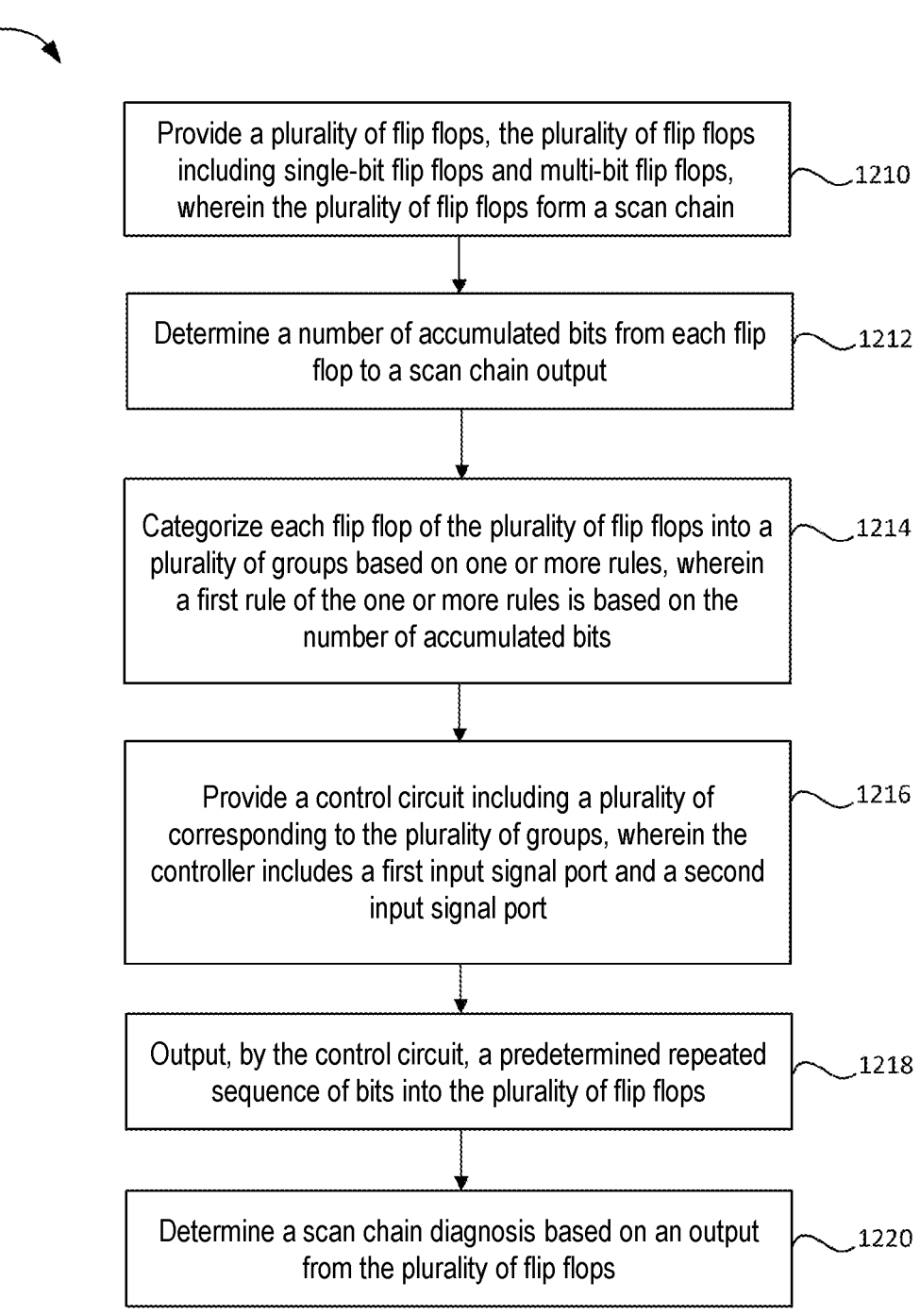

Provide a plurality of flip flops, the plurality of flip flops including single-bit flip flops and multi-bit flip flops, wherein the plurality of flip flops form a scan chain — 1210

Determine a number of accumulated bits from each flip flop to a scan chain output — 1212

Categorize each flip flop of the plurality of flip flops into a plurality of groups based on one or more rules, wherein a first rule of the one or more rules is based on the number of accumulated bits — 1214

Provide a control circuit including a plurality of corresponding to the plurality of groups, wherein the controller includes a first input signal port and a second input signal port — 1216

Output, by the control circuit, a predetermined repeated sequence of bits into the plurality of flip flops — 1218

Determine a scan chain diagnosis based on an output from the plurality of flip flops — 1220

FIG. 12

SCAN CHAIN CONTROL

BACKGROUND

Integrated circuits typically include thousands of components having complex interrelationships. These circuits are generally designed using highly automated processes known as electronic design automation (EDA). EDA begins from a functional specification provided in a hardware description language (HDL) and continues through the specification of a circuit design including the specification of elementary circuit components called cells, the physical arrangement of the cells, and the wiring that interconnects the cells. The cells implement logic or other electronic functions using a particular integrated circuit technology.

Using EDA, many different circuit designs can be implemented using various cell combinations. Commonly used cells include flip-flops. A flip-flop is a circuit that has two stable states and can be used to store state information. Flip-flops have one or more outputs and can be made to change state by signals applied to one or more control inputs. The stored state information may then be used for storing data within a memory cell.

Flip flops within a circuit can be connected in a chain like structure to form a scan chain. Scan chains allow for easier testing of the sequence of flip flops and are an example of design for testability (DFT) techniques to improve testing of the designed circuit. Also, a scan chain can include multi-bit flip flops and single bit flip flops. External automatic test equipment can deliver test pattern data to the sequence and an observed output indicates correct performance of the flip flops. For example, certain outputs of the scan chain indicate a stuck at bit fault or a hold time violation.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10 is an example method flow diagram for incorporating the control circuit of FIG. 1 in accordance with some embodiments.

FIG. 11 is an example method flow diagram for determining a scan chain diagnosis of a sequence of flip flops using the control circuit of FIG. 1 in accordance with some embodiments.

FIG. 12 is an example method flow diagram for providing a scan chain in accordance with some embodiments.

DETAILED DESCRIPTION

Figure 1:
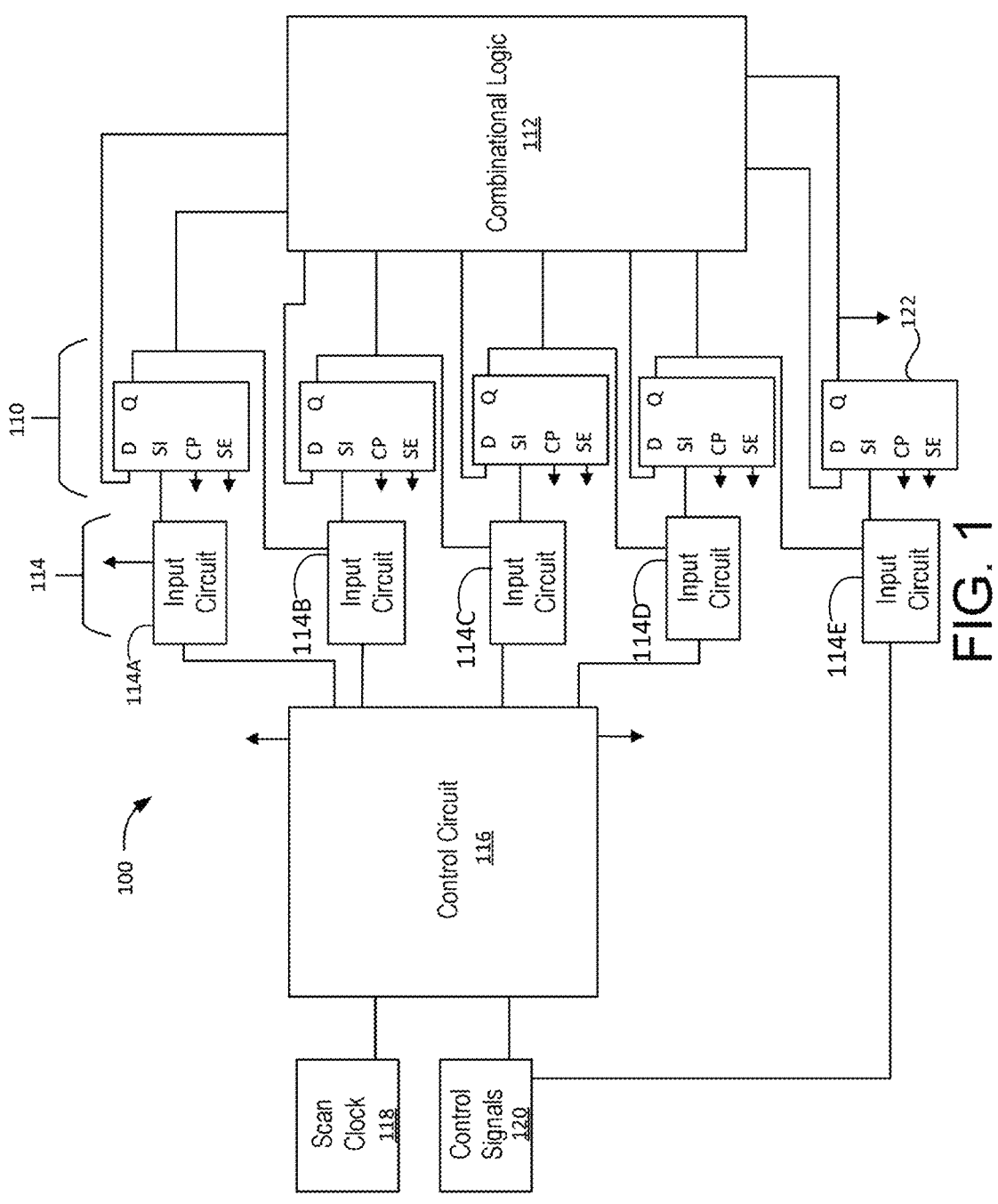
FIG. 1 is a block diagram of an example circuit with a scan chain for testing the sequence of flip flops in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Scan chains, as described above, help detect certain errors within a sequence of flip flops. For example, loading a repeated 0011/1100 into the entire scan chain allows for the determination of error such as a stuck at a certain bit fault or a hold time violation. In many product designs including scan chains, the sequence of flip flops is composed of single bit and multi-bit flip flops with the same number of bit flip flops not being next to each other. Since the different multi-bit flip flops require different number of clock cycle to properly load the repeated sequence of bits, the repeated sequence will require have to be loaded in parts.

Embodiments of the present disclosure are directed to scan chain systems and methods for inputting repeated sequences of bits to a sequence of flip flops that include multi-bit flip flops and single bit flip flops for efficient loading of a repeated sequence of bits. The scan chain system includes a control circuit that connects and supplies certain inputs to the sequence of flip flops in accordance with a number of clock pulses that depends on the maximum scan length of all flip flops in the scan chain to address these issues. With the added control circuit, a user can efficiently diagnose a scan chain with a repeated sequence of bits, such as 1100/0011. Further, each flip flop is categorized into one group of a plurality of groups. Each group of flip flops corresponds to an input of the control circuit that provides the required sequences based on the number of clock pulses to each group. Moreover, the added control circuit has a low area penalty for the circuit layout. Using the control circuit to generate control input signals for each multi-bit flip flop, a scan chain diagnosis can be determined that may indicate stuck at bit faults or hold time violations if there are errors in the sequence of flip flops. The information to form the control circuit is obtained from a netlist, control kit (ctl kit), and a scan chain report.

FIG. 1 is a block diagram of an example circuit with a scan chain for testing the sequence of flip flops. In the shown embodiment, circuit 100 includes a sequence of flip flops 110 that connect to combinational logic 112 for normal operation. Further, input circuits 114 connect to the Q output and D input of each flip flop 110 when the scan chain is in use for testing purposes. The input circuits 114 include an input circuit 114A, an input circuit 114B, an input circuit 114C, an input circuit 114D, and an input circuit 114E. Flip flops 110 also include single bit flip flop 122. The circuit 100 includes a control circuit 116 for supplying the correct sequence based on the flip flops group and number of clock pulses. The control circuit 116 receives input from a scan clock 118 and control signals 120.

As seen in this embodiment, the sequence of flip flops 110 form a scan chain that includes a D input for normal operation and a Q output that is connected to the combinational logic 112 and one of the input circuits 114 that corresponds to the next flip flop in the scan chain. Each flip flop 110 is a D flip flop in this embodiment, however, other types of flip flops may be used as well for scan chain testing, such as a SR flip flop, JK flip flop, or a T flip flop. The sequence of flip flops 110 includes different rating of flip flops regarding the number of bits. The multi-bit flip flops may include 2 bits, 4 bits or 12 bits, for example. While not shown, each multi-bit flip flop may include additional D inputs and Q outputs. For scan chain purposes, the multi-bit flip flops may also include multiple si inputs in some embodiments not shown here. Moreover, the sequence of flip flops 110 includes a single bit flip flop 122. Although only one single bit flip flop 122 is shown, many more may be included. During normal operation, the combinational logic 112 outputs from other connected parts of a circuit to the D input of each flip flop and receives output from the Q output of each flip flop 110. Input circuits 114, control circuit 116, scan clock 118, and control signals 120 are not used for normal operation. Combinational logic may include other components to form a memory cell or other registers to store data.

A circuit designer or other user may desire to test the components of a circuit using the scan chain. Input circuits 114 connect to a designated input si of each corresponding flip flop 110. Multi-bit input circuits of input circuits 114 receive input from the control circuit 116, while the input circuit that feeds into the single bit flip flop 122 directly receives control signals 120 rather than the control circuit 116. The control signals 120 include a mode0 and a mode1 signal in this embodiment. The control circuit 116 transmits a sequence of bits to each input circuit based on the corresponding flip flop's categorized group. Further, the sequence of bits is the max length (highest rated number of bits flip flop) within the scan chain and requires the same number of clock pulses. For example, if the max bit flip flop is 6 bits in length, then the specified number of bits in the sequence and clock pulses will also be 6. The control circuit generates these sequences using the inputs from the scan clock 118 and control signals 120. While only five total flip flops are shown, the control circuit can connect to many more flip flops. Further, each flip flop may have more inputs and outputs depending on its rated bit length. The added control circuit 116 and input circuits 114 also has a low area penalty. For example, the addition of the input circuits 114 and control circuit 116 results in an increase of 2.2525% in total area of the circuit 100 in some embodiments. While a certain number and order of flip flops is shown in circuit 100, many different configurations of flip flops and the control circuit can be used with the described system and function similarly.

Figure 2:
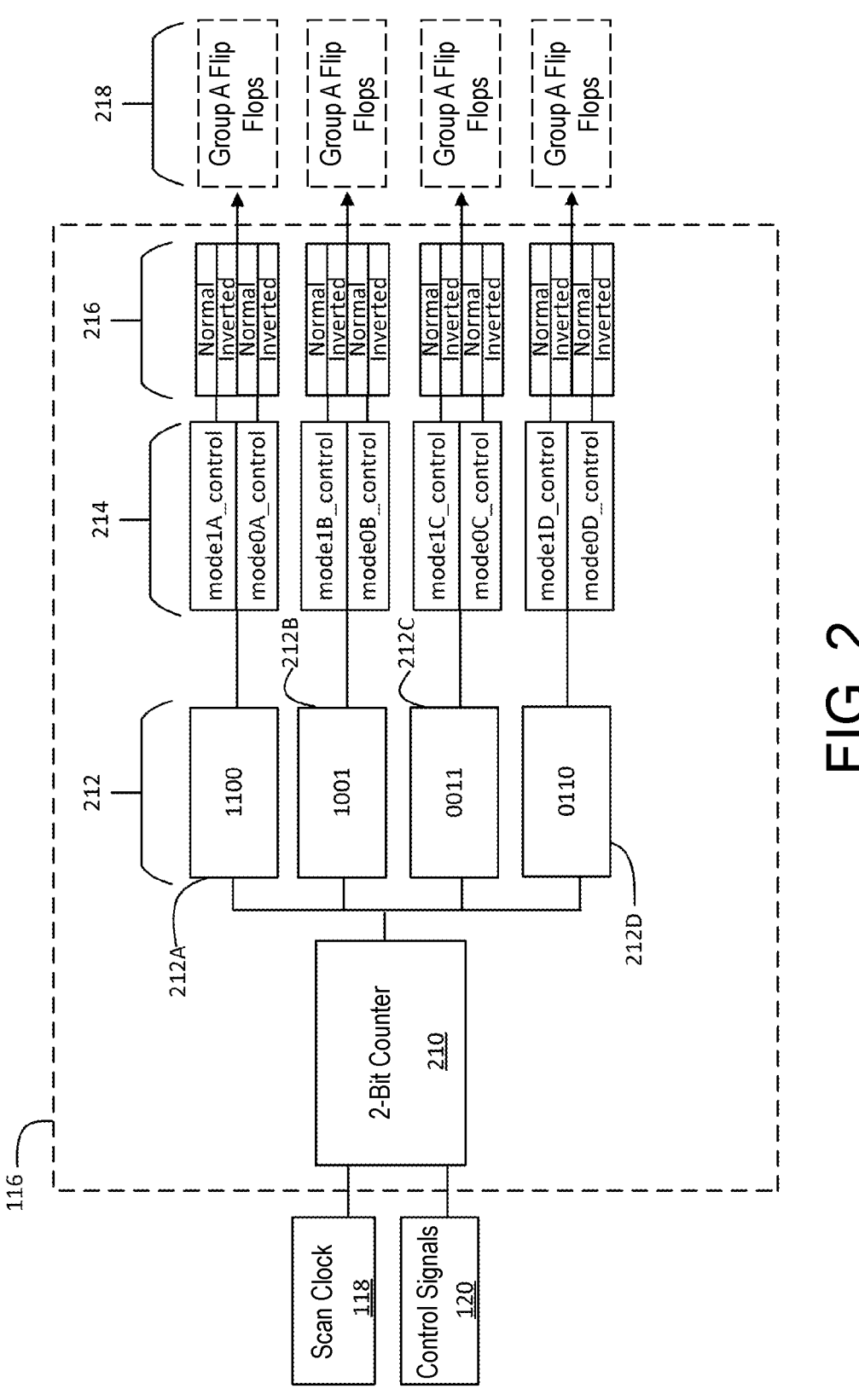
FIG. 2 is a block diagram of an example control circuit shown in FIG. 1 in accordance with some embodiments.

FIG. 2 is a block diagram of an example control circuit shown in FIG. 1. Control circuit 116, in this embodiment, is designed for a repeated sequence of 1100/0011, though other bit sequences are within the scope of the disclosure. As shown, control circuit 116 includes a counter circuit, which in the illustrated embodiment is a 2-bit counter 210 that receives input from the scan clock 118 and control signals 120. The 2-bit counter 210 outputs a category signal to each group input circuit of group input circuits 212, including group input circuit 212A, group input circuit 212B, group input circuit 212C, and group input circuit 212D. Each input circuit of group input circuits 212 then output corresponding signals to a corresponding group control circuit of the group control circuits 214. Each control circuit then outputs two normal and inverted signals 216, mode1x_control and mode0x_control to groups 218, which include a corresponding categorized group of flip flops.

The control circuit 116 receives inputs from the scan clock 118 and control signals 120 at the 2-bit counter 210. The 2-bit counter 210 includes two bits and can generate enough sequences for up to 4 groups. While shown as a 2-bit counter, 2-bit counter may be a M bit counter that can generate repeated bit sequences up to $N=2^M$ number of categorized groups as shown in associated with FIG. 8. The 2-bit outputs of the 2-bit counter 210 connect to group input circuits 212, which includes group input circuit 212A, group input circuit 212B, group input circuit 212C, and group input circuit 212D. As indicated each includes a repeated sequence of bits, such as 1100. Further, each repeated sequence is an offset of the other repeated sequences. For example, the repeated sequence of 1100 of group input circuit 212A shifts to the left by 1 bit to result in the repeated sequence of 1001 for group input circuit 212B.

From the group input circuits 212, the shown repeated sequence is transmitted to the group control circuits 214. Similarly to mode0 and mode1 being inputs for a scan chain without the control circuit, each group has a corresponding group control signal for mode0 and mode1 generated by its respective group control circuit of group control circuits 214. For example, mode1A_control circuit generates respective mode1A_ctrl signal. Each of these respective group control signals for mode0 and mode1 are then connected to a normal connection type and an inverted connection type that are then connected to respective groups 218.

Figure 3A:
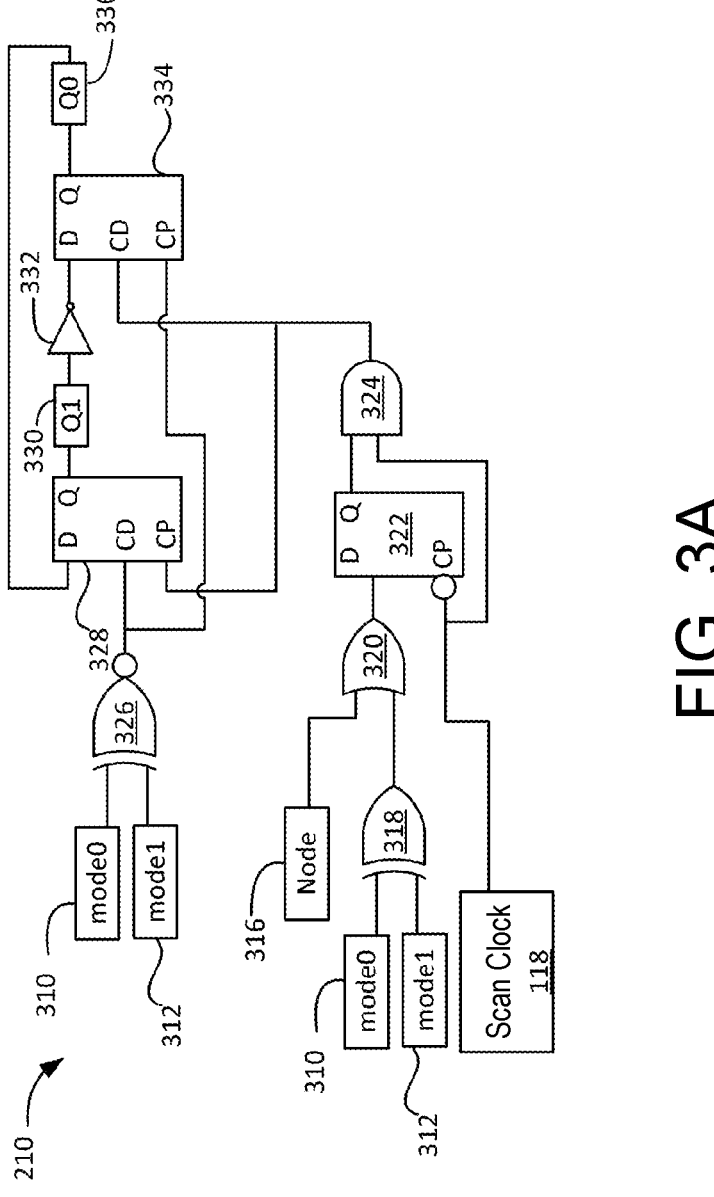
FIG. 3A illustrates an example logic diagram of the counter shown in FIG. 2 in accordance with some embodiments.

FIG. 3A illustrates an example logic diagram of the counter shown in FIG. 2. In the shown embodiment, mode0 310 and mode1 312 are output signals from the control signals 120. Both mode0 310 and mode1 312 connect to XOR gate 318 that then connects to OR gate 320. OR gate 320 also receives input from node signal 316. These signals are then fed into latch 322 along with the inverted scan clock 118. The latch 322 and scan clock 118 are received by AND gate 324. These signals are then provided to D flip flop 328 and D flip flop 334 that provide the counter bits Q1 330 and Q0 336, which are selection bits. Moreover, mode0 310 and mode1 312 also connect to an inverted XOR gate 326 that connects to both D flip flop 328 and D flip flop 334. D flip flop 328 connects to D flip flop 334 through NOT gate 332.

In this example, the 2-bit counter is a gray code counter to avoid glitches from an out of state transition. For example, the counter transitions through state 0 (00), state 1 (01), state 3 (11), and state 2 (10) then returns to state 0. However, other types of counters such a ring counter, a decimal counter, Mod N counter, a ripple counter, or other binary code counter may be used in other embodiments. Further, the components may include additional logic components not shown.

Figure 3B:
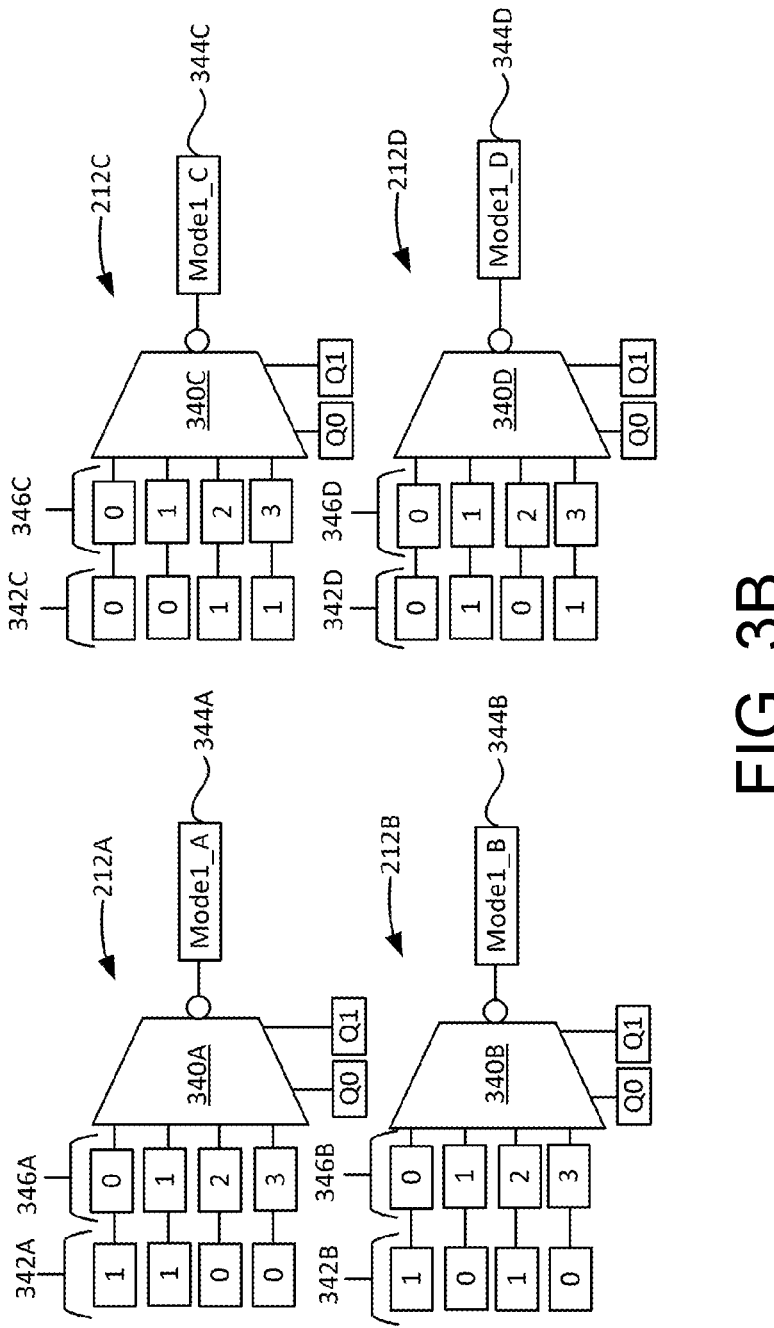
FIG. 3B illustrates an example logic diagram of input multiplexers for each offset of a desired input sequence in accordance with some embodiments.

FIG. 3B illustrates an example logic diagram of input multiplexers for each offset of a desired input sequence. Here, counter bits Q0 and Q1 are used as input to all four group input circuits 212A-D. Each group input circuit includes a corresponding multiplexer 340A, multiplexer 340B, multiplexer 340C, or multiplexer 340D and select signals 342A-D. Each select signals 342 connect to select pins 346 of the multiplexer 340. As each corresponding multiplexer receives the shown input signals 342A, 342B, 342C, and 342D and counter bits Q0 and Q1, the multiplexer 340A-D outputs a group output signal 344A, 344B, 344C, and 344D that includes a specified sequence of bits and offsets depending on the group.

In the shown embodiment, each of the group input circuit of group input circuits 212 is controlled by the output of the 2-bit counter 210. As the counter progresses through its different states or counts, each multiplexer 340A-340D generates a corresponding repeated sequence of bits. The select signals 342 show the input bits that result in the corresponding multiplexer outputting the correct sequence of repeated bits. For example, when a first clock pulse results in a 2-bit counter 210 output of Q1=0 and Q0=1 (state 1) and a second clock pulse results in a 2-bit counter 210 output of Q1=1 and Q0=1 (state 3), multiplexer 340A will output select pins for select pin (0) of select pins 346A first then output the select pin (3) of select pins 346A next. This pattern continues for each multiplexer 340A-D to generate each corresponding repeated pattern, which are 1100 for group input circuit 212A, 1001 for group input circuit 212B, 0011 for group input circuit 212C, and 0110 for group input circuit 212D. While shown with specific sequences and inputs, other embodiments may include different inputs and outputs for each group to achieve the same desired function.

Figure 4:
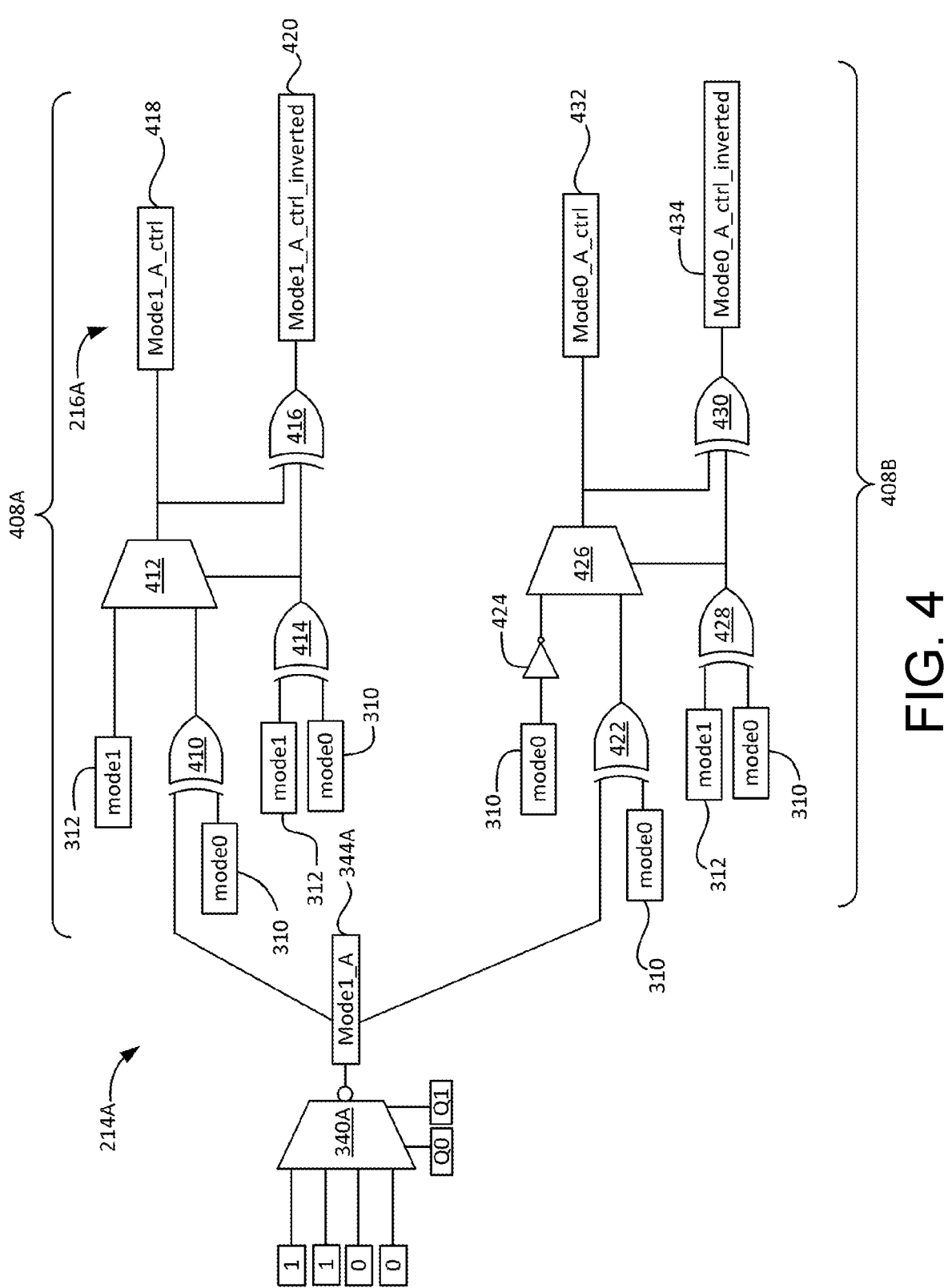
FIG. 4 is an example logic diagram of the mode control circuits of FIG. 2 in accordance with some embodiments.

FIG. 4 is an example logic diagram of the mode control circuits of FIG. 2. In the shown embodiment, multiplexer 340A outputs group output signal 344A to group control circuit 214A, which includes first group control circuit 408A and second group control circuit 408B. Output signal mode1_A 344A connects to XOR gate 410 and XOR gate 422. XOR gates receive mode0 310 as well. XOR gate 410 and XOR gate 422 then output to multiplexer 412 and multiplexer 426 respectively. Multiplexer 412 receives mode1 312 as input while multiplexer 426 receives mode0 inverted by NOT gate 424 as input. Both multiplexers receive an enabling signal from XOR gate 414 and XOR gate 428, respectively. Mode0 310 and mode1 312 are used as input to both XOR gate 414 and XOR gate 428. The output of multiplexer 412 is mode1_A_ctrl 418, and the output signal is also inverted by XOR gate 416 to become mode1_A_ctrl_inverted 420. A similar process occurs to produce mode0_A_ctrl 432 and mode0_A_ctrl_inverted

434. A XOR gate 430 receives input from the XOR 428 and the multiplexer 426, which then outputs the mode0_A_ctrl_inverted 434.

Here, group control circuit 214A is shown, but the remaining group control circuits 214B-D include the same or similar components and output their respective mode0 and mode1 ctrl signals. Both mode0_A_ctrl 432 and mode1_A_ctrl 418 are produced through this circuit and include the repeated sequence of bits based on the one or more rules discussed in association with FIG. 6. This repeated sequence will be a bit length of the max rated flip flop within the scan chain as previously mentioned. While group control circuits 214B-D include the same or similar components as group control circuit 214A, those circuits produce the corresponding repeated pattern. Also, both mode1_A_ctrl_inverted and mode0_A_ctrl_inverted are produced along side the normal version of the signals. Both will not connect to a single flip flop within the group but are chosen based on the one or more rules discussed in connection with FIG. 7.

Figure 5:
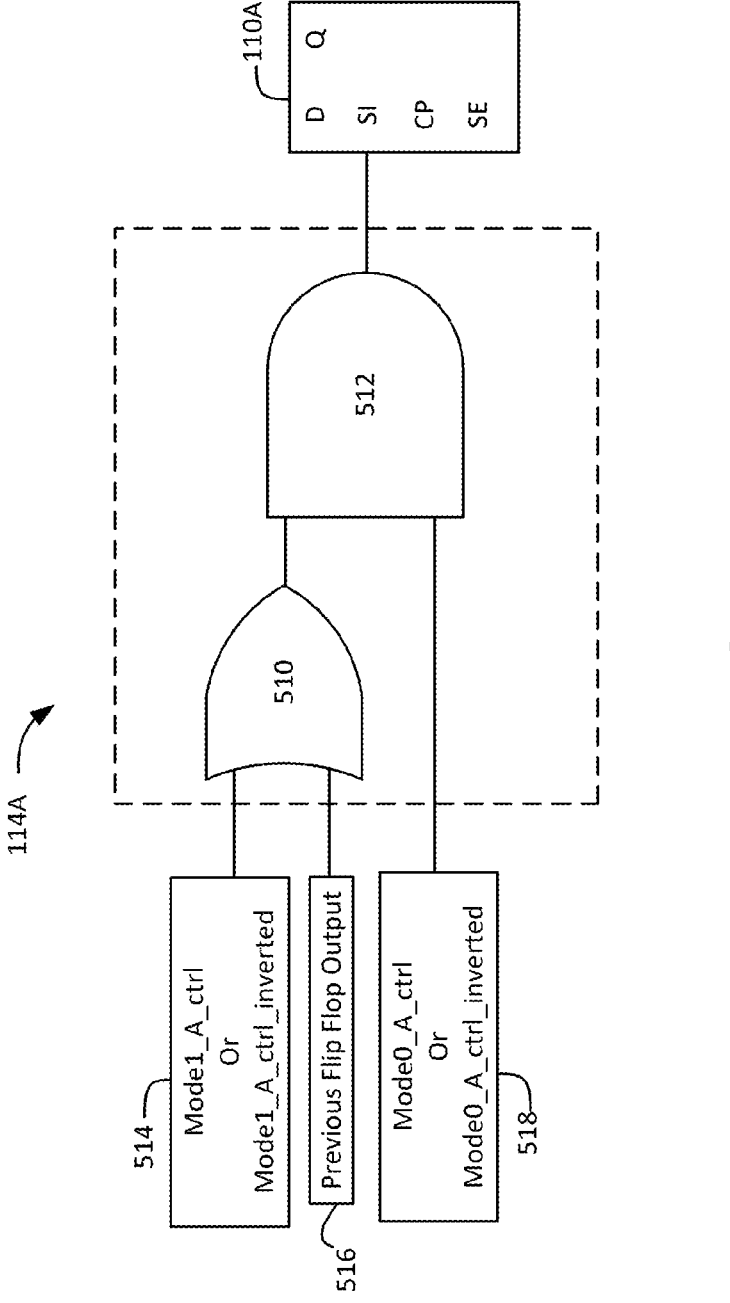
FIG. 5 is an example logic diagram of an input circuit for a flip flop as shown in FIG. 1 in accordance with some embodiments.

FIG. 5 is an example logic diagram of an input circuit for a flip flop as shown in FIG. 1. As seen, input circuit 114A includes an OR gate 510 and AND gate 512. OR gate 510 receives input 514, which may be mode1_A_ctrl 418 or mode1_A_ctrl_inverted 420, and the previous flip flops input 516. OR gate then outputs a signal to AND gate 512, which also receives input 518 which is either mode0_A_ctrl 432 or mode0_A_ctrl_inverted 434. AND gate 512 then outputs to the si input of D flip flop 110A.

As shown, the input circuit receives three inputs, input 514, input 516, and input 518. Input 514, depending on the chosen connection, will be the mode1_A_ctrl or mode1_A_ctrl_inverted signal. If the connected flip flop 110A is a single bit flip flop, then input 514 is mode1. Input 516 is the Q output of the previous flip flop connected as shown in FIG. 1. Mode0 also directly connects to input 518 if flip flop 110A is a single bit flip flop.

Figure 6:
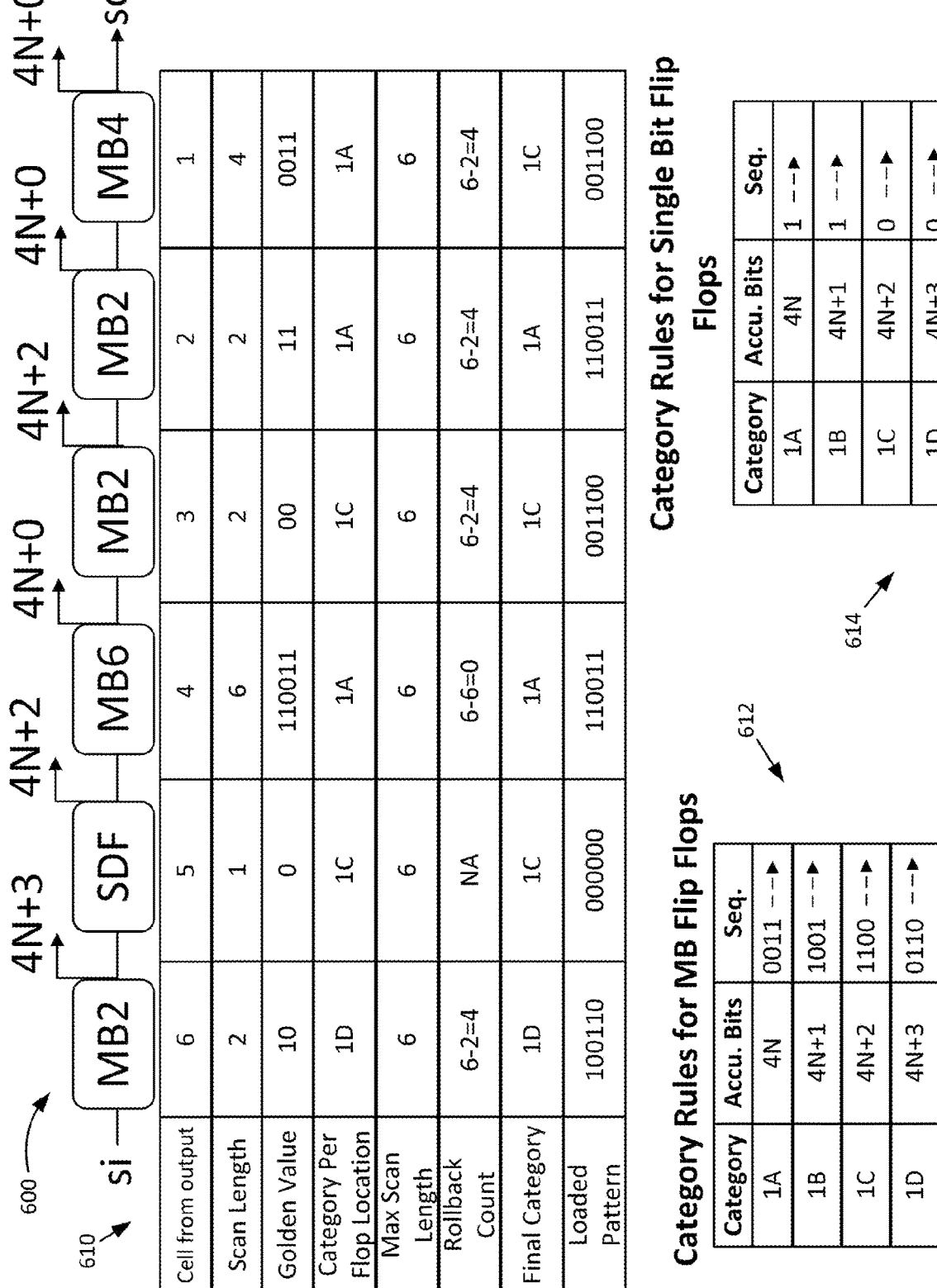
FIG. 6 illustrates example tables for categorizing a sequence of flip flops in accordance with some embodiments.

FIG. 6 illustrates example tables for categorizing a sequence of flip flops. In this embodiment, rule logic table 610 shows the steps of classifying corresponding bits in the above sequence 600 using category rules for MB flip flops 612 for multi-bit flip flops and category rules 614 for single bit flip flops.

Sequence 600 includes a plurality of multi-bits and single bit flip flops that form a scan chain. As illustrated the 4N+X above each flip flop indicates the preceding sequence that is accumulated at output so, not including the current cell. For example, no bits have been accumulated at cell 1, thus, the accumulated bits are 0, a multiple of 4N or 4*0 with no remainder. Based on this determination, cell 1 is categorized as 1A. Cell 1's length is 4 bits, thus, the detected output is 0011 (the reverse of the input 1100). Each flip flop's category per location is classified in this way as shown in rule logic table 610.

The max scan length is the largest multi-bit flip flop in the sequence since the clock pulses that many times to load the pattern, which in the shown embodiment, is a length of 6. This max length is obtained from a ctl kit of the circuit. Accordingly, smaller multi-bit flip flops will receive additional pulses. The smaller multi-bit flip flops use a rollback count to handle these extra pulses. The system then recategorizes the cell based on the new accumulated bits with the extra clock pulses as seen in rule logic table 610. As an example, cell 1 now accumulates two bits that are 00 to handle the extra clock pulses. These extra accumulated bits result in a 4N+2 categorization from category rules for MB flip flops 612, thus, resulting in a 1C final classification.

Accordingly, cell 1 will receive mode0_C_ctrl and mode1_C_ctrl from the control circuit at its input circuit when a scan chain diagnosis is performed.

For single bit flip flops, the extra pulses do not apply since the single bit flip flops are directly connected to the control signals 120, mode0 and mode1 and are fixed. As a result, its classification does not change from its original location classification. With these rules, flip flops in each final category share the same type of control sequence and category and share clock pulses. The result of connecting the previously described circuits in accordance with rule logic table 610, category rules for MB flip flops 612, and category rules for single bit is a repeated sequence of 1100/0011.

Figure 7:
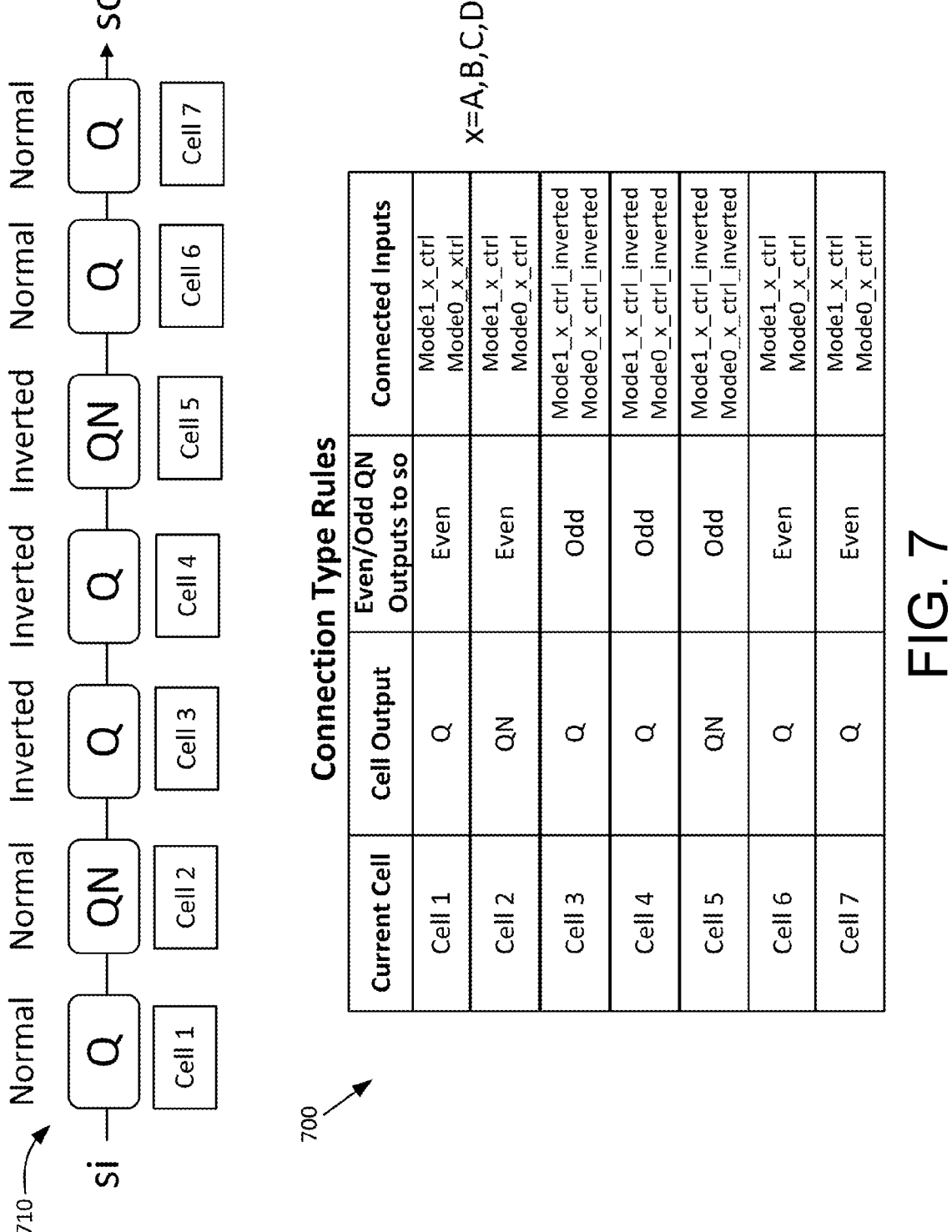
FIG. 7 illustrates an example table for selecting a normal or inverted input for a sequence of flip flops in accordance with some embodiments.

FIG. 7 illustrates an example table for selecting a normal or inverted input for a sequence of flip flops. In the shown embodiment, connection type rules 700 are used to determine the connection type for each cell/flip flop in sequence 710, i.e., normal or inverted.

Connection type rules 700 provide the rules for classifying the flip flops in sequence 710 for a normal connection or inverted connection. In this embodiment, a QN cell output is a cell with only an inverted output in relation to the D/si pin. These QN flip flops in the scan chain act like inverters during the shift phase. Applying the rules includes determining the amount of QN cells from the current cell, which includes the current cell, to the scan chain output (so) output. If the number of QN flip flops is odd, then that flip flop's input circuit receives the mode1_x_ctrl_inverted and mode0_x_ctrl_inverted signals as opposed to the normal versions, mode1_x_ctrl and mode0_x_ctrl. For example, the number of QN cells from cell 2, including the current cell, are even, thus it receives a normal connection at its input circuit. Also, single bits directly connect to mode0 and mode1 control signals 120 and are not inverted in this embodiment.

Figure 8:
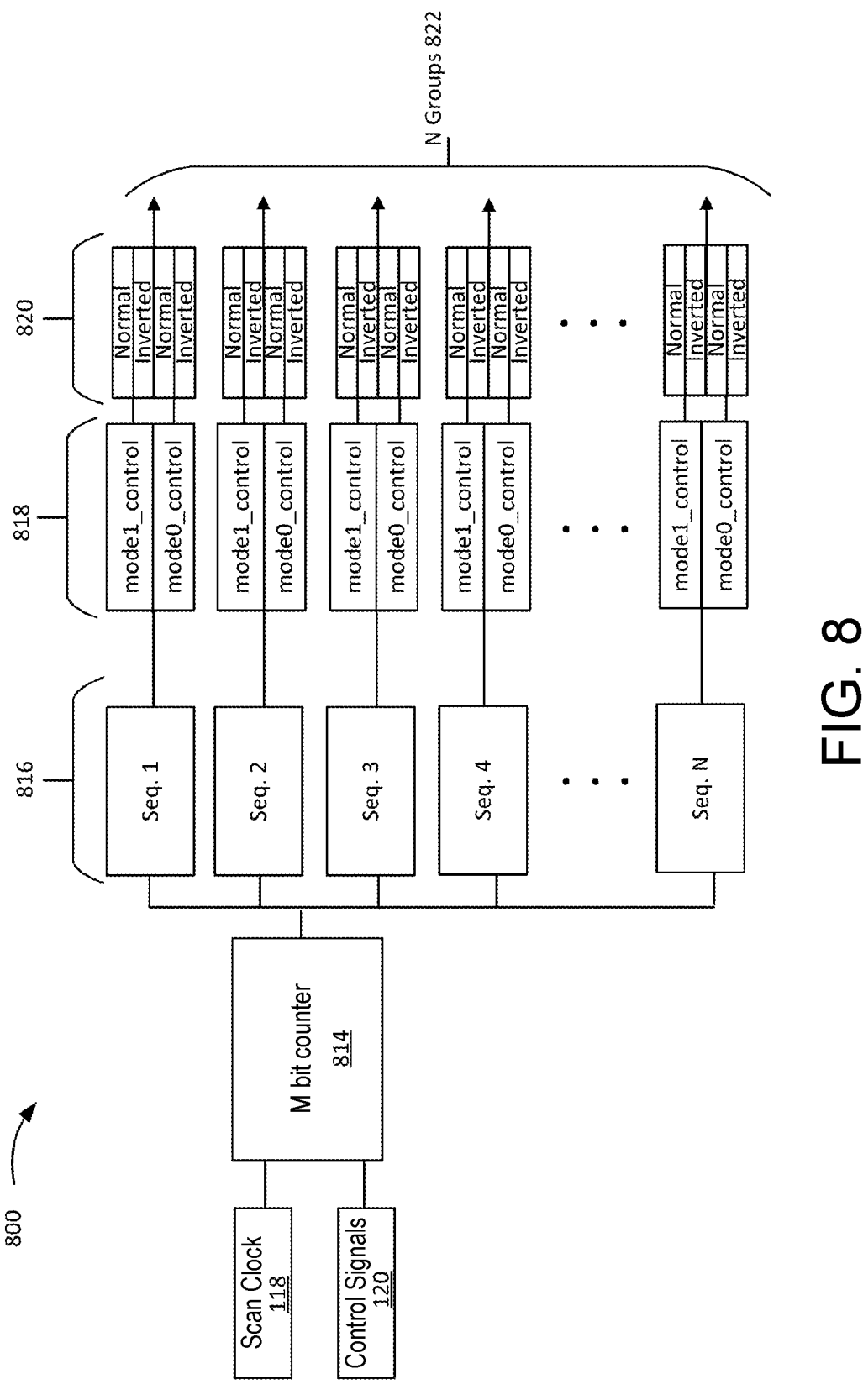
FIG. 8 illustrates an alternative embodiment of the control circuit used in FIG. 1 in accordance with some embodiments.

FIG. 8 illustrates an alternative embodiment of the control circuit used in FIG. 1. Rather than only a 2-bit counter that produces sequences of 4 bits and 4 groups, control circuit 800 can be used to classify up to N groups. M bit counter 814 receives input signals from scan clock 118 and control signals 120. M bit counter 814 then outputs N number of output signals to N sequence circuits 816. Then group control circuits 818 receive the corresponding sequences and output corresponding signals 820 to N groups 822 of flip flops.

In this embodiment, the bit counter is not limited to 2, but becomes the specified bits to produce N groups 822. As previously mentioned, the number of N groups that can be supported by M bit counter is found by the formula $N=2^M$.

Figure 9:
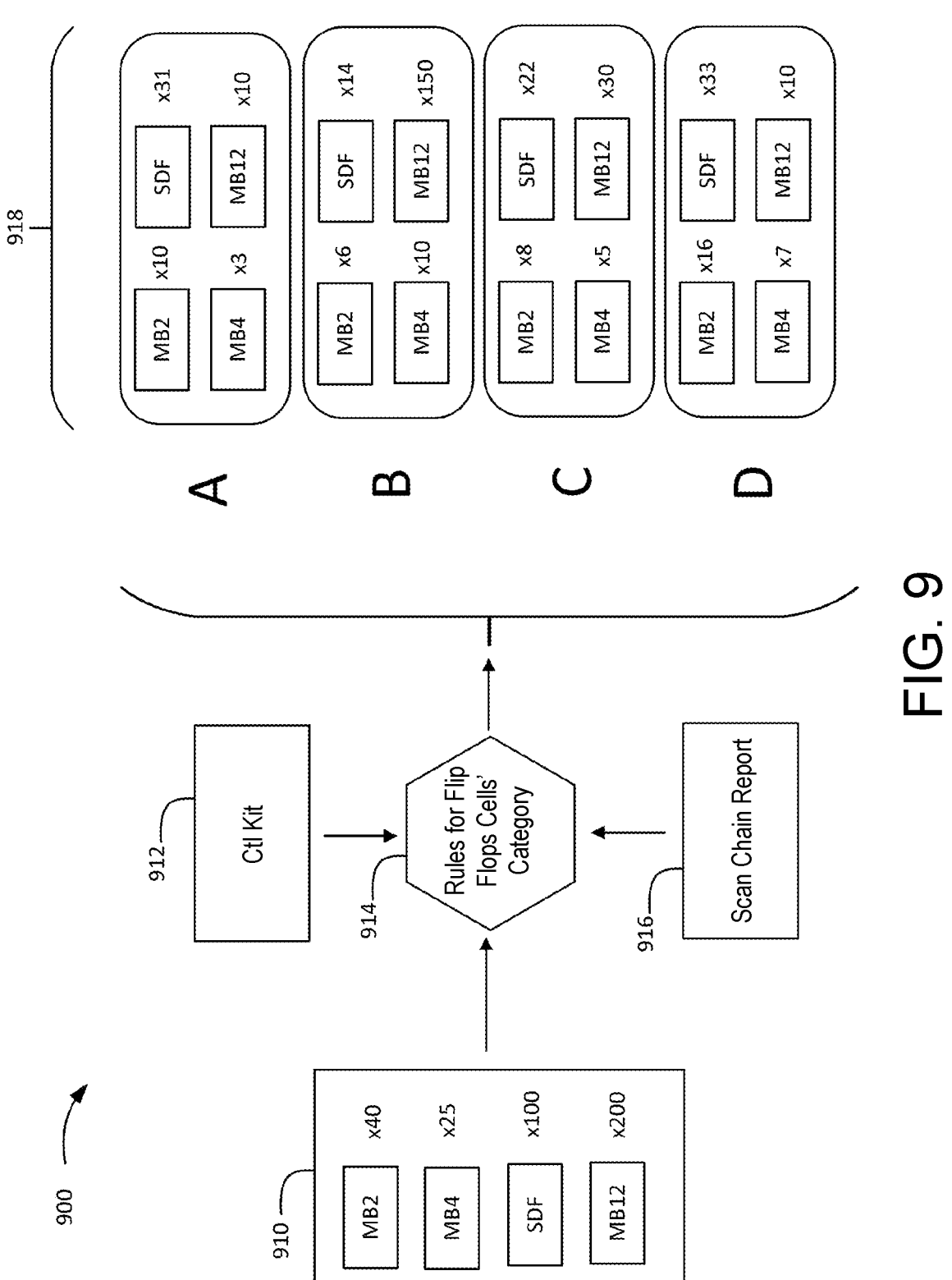
FIG. 9 illustrates an example process for categorizing a sequence of flip flops in accordance with some embodiments.

FIG. 9 illustrates an example process for categorizing a sequence of flip flops. Here, the process 900 includes the rules for categories 914 receiving ctl kits 912, netlist 910, and the scan chain report 916 to classify the sequence of flip flops into a plurality of groups 918.

The rules for categories 914 are one or more rules previously described to classify multi-bit flip flops. The ctl kit provides the multi-bit cell's scan length information, the scan chain information comes from scan chain report, and the number of flip flops comes from the netlist. Using this information, the previously described circuits can be produced. For example, a sequence of flip flops can be synthesized. The netlist is formed from the sequence. Then the DFT insertion of the other components, such as the input circuits, results in the testable scan chain. The scan chain report, ctl kit, and netlist then become known. The control circuit is added and appropriate group connections are made to corresponding flip flops. For example, once netlist 910 with all indicated flip flops are categorized using rules for flip flop cells' category, each flip flop is categorized into the plurality of groups 918. As previously mentioned, these one or more rules may be the rules previously described.

FIG. 10 is an example method for incorporating the control circuit of FIG. 1. In the shown embodiment, the method 1000 includes operations 1010-1018 result in connecting a control circuit to facilitate a scan chain with repeated sequences.

Operation 1010 includes providing a control circuit and control signal input ports to a circuit. The control circuit may be the control circuit 116 and mode0 and mode1 input ports are the control signals 120.

At operation 1012, one or more flip flops are categorized into a plurality of groups. The one or more flip flops may include multi-bit flip flops and single bit flip flops that are in a sequence and form a scan chain. Moreover, the flip flops may be categorized using one or more rules previously discussed.

At operation 1014, a normal connection type or an inverted connection type to the control circuit is selected for each categorized flip flop. The normal connection and inverted connection may depend on the number of inverted output flip flops between a current cell and the so output.

At operation 1016, the control circuits outputs are connected to corresponding input cell of each categorized multi-bit flip flop. The control circuits include an inverted and normal connection type that is connected based on the previous selection. The input cell also may be one of input circuits 114.

At operation 1018, the input cell for each single bit flip flop is directly connected to the mode0 and mode1 connection ports, regardless of its group. The single bit flip flop may be single bit flip flop 122. The shown method may further include determining a scan chain diagnosis using the provided control circuit and flip flops.

FIG. 11 is an example method for determining a scan chain diagnosis of a sequence of flip flops using the control circuit of FIG. 1. In the shown embodiment, the method 1100 operations 1110-1120 use a control circuit as previously described to determine a scan chain diagnosis that includes possible hold time violations or stuck at a bit fault.

Operation 1110 includes receiving, by a control circuit, one or more input signals and a scan clock signal. The one or more input signals may be control signals 120 and the scan clock signal may be scan clock 118. The control circuit may be control circuit 116 in some embodiments.

At operation 1112, the control circuit generates a plurality of input bits, wherein the plurality of input bits includes a repeated sequence of bits and offsets of the repeated sequence of bits. The repeated sequence may be a repeated 1100/0011 as described in association with FIGS. 2-7. Further, the control circuit may generate the plurality of input bits using the 2-bit counter 210 to produce the selected sequences and respective offsets that are provided to group input circuit 212A-D. The group control circuits 214 may then receive the repeated sequences to produce the categorized mode0 and mode1 signals for each group such as generating the plurality of group control signals based on the plurality of input bits described in operation 1114.

Proceeding to operation 1116, the control circuit provides each group control signal to a corresponding group of a plurality of groups, wherein each group of the plurality of groups include one or more classified flip flops, wherein the one or more classified flip flops form a scan chain. The flip flops may be classified into four groups A, B, C, and D of groups 918. Using the received input, the flip flops may then have a respective output. The output can be detected from the one or more classified flip flops in operation 1118. Then, a scan chain diagnosis is determined based on the detected output at operation 1120.

FIG. 12 is an example method flow diagram for providing a scan chain. In this embodiment, the shown method 1200 provides a plurality of flip flops that are connected in a sequence. The flip flops are then connected to a provided control circuit based on a categorization. A scan chain diagnosis can then be detected.

At operation 1210, a plurality of flip flops is provided. The plurality of flip flops includes single-bit flip flops and multi-bit flip flops. This plurality forms a scan chain. The plurality of flip flops may be flip flops 110. The number of accumulated bits from each flip flop to a scan chain output is determined at operation 1212. The accumulated bits include the current cell/flip flop as discussed with connection type rules 700.

Proceeding to operation 1214, each flip flop is categorized into a plurality of groups based on one or more rules, wherein a first rule of the one or more rules is based on the number of accumulated bits. These accumulated bits then determine the category for the flip flop. Further, this operation may include determining a max scan length for the plurality of flip flops. Then, a rollback count based on the max scan length is added to each multi-bit flip flop of the plurality of flip flops. Each flip flop may then be re-categorized into a final category.

At operation 1216, a control circuit is provided including a plurality of corresponding to the plurality of groups, wherein the control circuit includes a first input signal port and a second input signal port. the control circuit may be control circuit 116 that connects to control signals 120 and include a mode0 and mode1 as previously discussed. A predetermined repeated sequence of bits is inputted to the plurality of flip flops at operation 1218. This step may use the control circuit to provide the proper repeated sequence based on each flip flops category. A scan chain diagnosis based on the output from the plurality of flip flops is then determined at operation 1220.

The method may further include determine a number of flip flops with inverted output between each flip flop of the sequence of flip flops and a scan chain output and select an inverted connection type based on the determined number being odd. Then, a normal connection type is selected based on the determined number being even. These connection types are selected using connection type rules 700. Moreover, the scan chain diagnosis may include a stuck at bit fault or a hold time violation.

According to some examples, a control circuit for loading a repeated sequence to a scan chain sequence of flip flops includes a bit counter configured to receive as input a first control signal, a second control signal, and a scan clock signal, the bit counter further configured to output a first bit and a second bit based on the first control signal, the second control signal, and the scan clock signal. The control circuit further includes a multiplexer configured to receive the first bit and the second bit as input and output a sequence of bits, a first group control circuit configured to receive the sequence of bits as input and output a first group control signal, and a second group control circuit configured to receive the sequence of bits as input and output a second group control signal.

According to other examples, a scan chain circuit includes a plurality of flip flops, the plurality of flip flops including single bit flip flops and multi-bit flip flops and are in a predetermined output to input sequence. The scan chain circuit further includes a first control signal, a second control signal, and a scan clock signal; and a control circuit comprising: a bit counter configured to receive as input the first control signal, the second control signal, and a scan clock signal, the bit counter further configured to output a first bit and a second bit; one or more multiplexers configured to receive the first bit and the second bit as input and output a sequence of bits. The control circuit further includes one or more first group control circuits configured to receive the sequence of bits as input and output a first group control signal to one or more corresponding multi-bit flip flops; and one or more second group control circuits configured to receive the sequence of bits as input and output a second group control signal to the one or more corresponding multi-bit flip flop.

According to further examples, a method for testing a plurality of flip flops includes providing a plurality of flip flops, wherein the plurality of flip flops includes one or more single bit flip flops and one or more multi-bit flip flops, the one or more single bit flip flops and the one or more multi-bit flip flops in a predetermined output to input sequence. The method further includes determining a number of accumulated bits from each flip flop to a scan chain output; categorizing each flip flop of the plurality of flip flops into a plurality of groups based on one or more rules, wherein a first rule of the one or more rules is based on the number of accumulated bits. The method further includes providing a control circuit including a plurality of outputs corresponding to the plurality of groups, wherein the control circuit includes a first input signal port and a second input signal port. The method further includes outputting, by the control circuit, a predetermined repeated sequence of bits into the plurality of flip flops; and determine a scan chain diagnosis based on an output from the plurality of flip flops.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A control circuit for loading a repeated sequence to a plurality of flip flops, the control circuit comprising:

a bit counter configured to receive as input a first control signal, a second control signal, and a scan clock signal, the bit counter further configured to output a first bit and a second bit based on the first control signal, the second control signal, and the scan clock signal;

a multiplexer configured to receive the first bit and the second bit as input and output a sequence of bits;

a first group control circuit configured to receive the sequence of bits as input and output a first group control signal; and a second group control circuit configured to receive the sequence of bits as input and output a second group control signal.

2. The control circuit of claim 1, wherein:

the first group control circuit is further configured to output an inverted first group control signal; and the second group control circuit is further configured to output an inverted second group control signal.

3. The control circuit of claim 2, wherein:

the first group control circuit connects the first group control signal to a test input of the one or more corresponding flip flops that include an even number of inverted output flip flops between the test input of the one or more corresponding flip flops and a scan chain output;

the first group control circuit connects the inverted first group control signal to a test chain input of the one or more corresponding flip flops that include an odd number of inverted output flip flops between the test input of the one or more corresponding flip flops and the scan chain output;

the second group control circuit connects the second group control signal to the test input of the one or more corresponding flip flops that include the even number of inverted output flip flops between the test input of the one or more corresponding flip flops and the scan chain output; and the second group control circuit connects the inverted second group control signal to the test input of the one or more corresponding flip flops that include the odd number of inverted output flip flops between the test input of the one or more corresponding flip flops and the scan chain output.

4. The control circuit of claim 1, wherein the bit counter includes:

a first flip flop counter configured to output the first bit;

an inverter configured to receive the first bit and output an inverted first bit; and a second flip flop counter configured to receive the inverted first bit and output the second bit.

5. The control circuit of claim 1, wherein the multiplexer is configured to output a different offset of the sequence of bits.

6. The control circuit of claim 5, wherein the sequence of bits is four bits in length.

7. The control circuit of claim 1, further comprising a second multiplexer, a third group control circuit, and a fourth group control circuit.

8. The control circuit of claim 1, wherein the first group control signal and second group control signal are inputted to a input circuit of a corresponding flip flop.

9. The control circuit of claim 1, wherein the first group control circuit includes:

a first control multiplexer that receives as input an exclusive-or output signal, the sequence of bits, and an exclusive-or selection signal, the first control multiplexer outputting a first group input signal.

10. A scan chain circuit, comprising:

a plurality of flip flops, the plurality of flip flops including single bit flip flops and multi-bit flip flops and are in a predetermined output to input sequence; and a control circuit comprising:

a bit counter configured to receive as input a first control signal, a second control signal, and a scan clock signal, the bit counter further configured to output a first bit and a second bit;

one or more multiplexers configured to receive the first bit and the second bit as input and output a sequence of bits;

one or more first group control circuits configured to receive the sequence of bits as input and output a first group control signal to one or more corresponding multi-bit flip flops; and one or more second group control circuits configured to receive the sequence of bits as input and output a second group control signal to the one or more corresponding multi-bit flip flops.

11. The scan chain circuit of claim 10, wherein a single bit flip flop of the plurality of flip flops is configured to directly receive the first control signal and the second control signal as input.

12. The scan chain circuit of claim 10, wherein each flip flop of the plurality of flip flops includes:

an or gate configured to receive the first group control signal and an output from a previous flip flop; and an and gate configured to receive the output of the or gate and an inverted signal of the second group control signal as input, the and gate outputting a signal to the flip flop.

13. The scan chain circuit of claim 10, wherein:

the one or more first group control circuits are further configured to output an inverted first group control signal; and the one or more second group control circuits are further configured to output an inverted second group control signal.

14. The scan chain circuit of claim 10, wherein the bit counter includes:

a first flip flop counter configured to output the second bit;

an inverter configured to receive the first bit and output an inverted first bit; and a second flip flop counter configured to receive the inverted first bit and output the second bit.

15. The scan chain circuit of claim 10, wherein each multiplexer of the one or more multiplexers is configured to output a different offset of the sequence of bits.

16. The scan chain circuit of claim 10, wherein the sequence of bits is four bits in length.

17. The scan chain circuit of claim 10, wherein the one or more first group control circuit includes a first control multiplexer that receives as input an exclusive-or output signal, the sequence of bits, and an exclusive-or selection signal, the first control multiplexer outputting a first group input signal.

18. A method for testing a plurality of flip flops, comprising:

providing a plurality of flip flops, wherein the plurality of flip flops includes one or more single bit flip flops and one or more multi-bit flip flops, the one or more single bit flip flops and the one or more multi-bit flip flops in a predetermined output to input sequence;

determining a number of accumulated bits from each flip flop to a scan chain output;

categorizing each flip flop of the plurality of flip flops into a plurality of groups based on one or more rules, wherein a first rule of the one or more rules is based on the number of accumulated bits;

providing a control circuit including a plurality of outputs corresponding to the plurality of groups, wherein the control circuit includes a first input signal port and a second input signal port;

outputting, by the control circuit, a predetermined repeated sequence of bits into the plurality of flip flops; and determining a scan chain diagnosis based on an output from the plurality of flip flops.

19. The method of claim 18, further comprising selecting a normal connection type or an inverted connection type, wherein selecting the normal connection type or the inverted connection type includes:

determining a number of flip flops with inverted output between each flip flop of the sequence of flip flops and the scan chain output;

selecting the inverted connection type based on the number of flip flops being odd; and selecting the normal connection type based on the number of flip flops being even.

20. The method of claim 18, wherein the scan chain diagnosis includes a stuck at bit fault or a hold time violation.

\* \* \* \* \*